United States Patent [19]

Spierings

[11] 4,225,633
[45] Sep. 30, 1980

[54] METHOD OF MAKING A LINE-SHAPED OPENING IN A COATING ON A PLASTICS FOIL

[76] Inventor: Ferdinand H. F. G. Spierings, Asserpark 11, Wageningen, Netherlands

[21] Appl. No.: 864,729

[22] Filed: Dec. 27, 1977

[30] Foreign Application Priority Data

Jan. 6, 1977 [NL] Netherlands .................. 7700081

[51] Int. Cl.² .................. B05D 5/12; B41M 3/08; B32B 31/00
[52] U.S. Cl. .................. 427/96; 29/832; 427/125; 427/289; 427/276; 427/277; 264/154; 83/875; 83/171; 156/268
[58] Field of Search .................. 156/250, 268; 427/289, 427/125, 58, 277, 276, 96; 264/154, 106, 104; 83/875, 879, 880, 171; 29/625; 336/200

[56] References Cited

U.S. PATENT DOCUMENTS

| | | | |
|---|---|---|---|
| 1,674,047 | 6/1928 | Bombard et al. | 427/277 |
| 2,383,567 | 8/1945 | Rudnick | 427/277 |
| 2,427,144 | 9/1947 | Jansen | 29/625 |
| 2,911,605 | 11/1959 | Wales | 336/200 |
| 3,469,479 | 9/1969 | Calemard | 83/171 |
| 3,555,950 | 1/1971 | Gijsbers | 83/171 |
| 3,578,538 | 5/1971 | Prosser et al. | 156/268 |
| 3,699,644 | 10/1972 | Cocca | 83/880 |
| 3,823,333 | 7/1974 | Spierings | 310/11 |
| 3,874,075 | 4/1975 | Lohse | 336/200 |
| 3,967,144 | 6/1976 | Francisus | 310/10 |
| 4,081,653 | 3/1978 | Koo | 427/96 |

Primary Examiner—Douglas J. Drummond
Attorney, Agent, or Firm—Roylance, Abrams, Berdo & Farley

[57] ABSTRACT

A method of applying a line-shaped opening in a coating on a plastics foil, in which a part 3 having a pointed end is moved according to a line 4 in contact with the coating 2, while the temperature of the part 3 lies in the melting range of the foil 1 and the pressure exerted on the part 3 together with the rate of movement of the part 3 is such that the coating 2 with a portion of the subjacent foil 1, considered in thickness direction, is cut through according to the line 4.

2 Claims, 5 Drawing Figures

U.S. Patent    Sep. 30, 1980    4,225,633
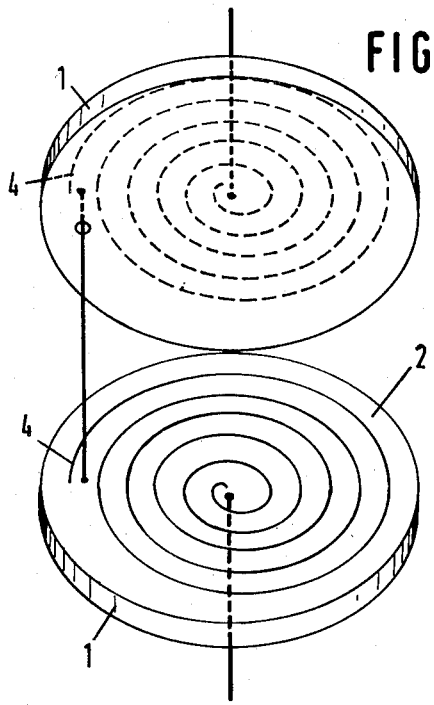
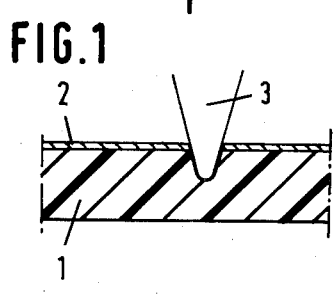
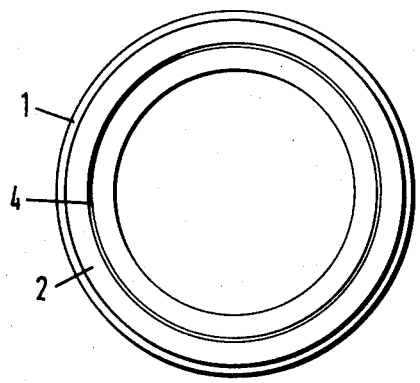
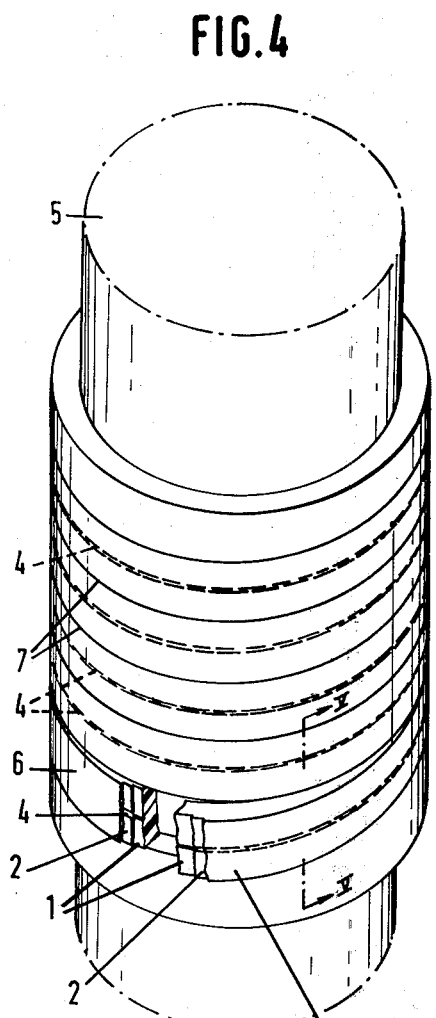
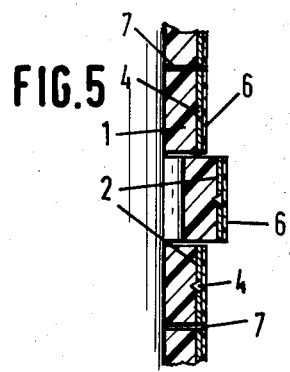

METHOD OF MAKING A LINE-SHAPED OPENING IN A COATING ON A PLASTICS FOIL

The present invention relates to a method of making a line-shaped opening in a coating on a plastics foil.

In many fields of the art it is often desired to make a line-shaped opening in a coating positioned on a plastics foil. Reference can be made in this connection, for example, to the forming of patterns in a light-impermeable coating positioned on a light-transparent foil. A different field in which such a method may be applicable is found with plastics foils which are coated with a conductive coating, as will be explained in the following.

In order to be able to apply such a line-shaped opening in a simple and effective manner in such a coating on a plastics foil according to the invention, a part having a pointed end is moved according to a line in contact with the coating, the temperature of the part lying in the melting range of the foil and the pressure exerted on the part and the rate of movement of the part being such that the coating with a portion of the subjacent foil, seen in the thickness direction, is intersected according to the line.

In a specific application of said method it is possible in a circular plastics foil wherein the coating comprises an electrically conductive material, extending along a peripheral region of the circular foil, to move the part along a circular path which is positioned within the limits of the conductive peripheral region and the thus formed circular regions, electrically insulated relative to each other, can each be connected to a separate discharge means. Such a method can be successfully applied for the manufacture of a plastics foil disc having two spaced apart electrodes insulated electrically relative to each other, as defined in Dutch patent application No. 7406582, now Dutch Pat. No. 160,118, which corresponds to U.S. Pat. No. 3,967,144, particularly in column 2, lines 50-55, of U.S. Pat. No. 3,967,144 wherein reversible electrodes are disclosed as being obtained by electrochemical surface treatment of the electrically conductive material with HCl to form AgCl layers on the surfaces thereof.

It is also possible according to the present invention, in a coating of an electrically conductive material to move the part on a disc-shaped plastics foil along a spiral path, while treating a number of such foils in this manner, with varying sense of direction of the paths from foil to foil and to connect of each pair of foils having opposite sense of direction of the paths always the inner, or the outer end of the spiral path electrically conductively to the opposite side of the respective foil while stacking the foils having opposite sense of direction of the paths. The end product of such a method is a coil having a plurality of windings which are accommodated within a comparatively small volume.

According to the present invention it is also possible to position in a coating consisting of electrically conductive material, the plastics foil as a cylindrical sleeve on a drum, while rotating the drum and moving the part simultaneously in the axial direction of the drum, applying on the plastics sleeve a layer of electrically insulating material while cutting through the plastics sleeve between the windings of the formed helical path, thus obtaining a flat conductor having two electrically insulated cores.

Furthermore it is possible, in a coating consisting of an electrically conductive material on a circular foil of plastics material, to move a second part having a pointed end along a line parallel to and spaced apart from said line in a similar manner and under the same circumstances as the former part, together with said part along a spiral path, insulating one end of each spiral conductive path from the remaining conductive coating while connecting the other end of each path to a respective discharge means. Again there is obtained an electrode system which can be applied in an apparatus as described in the above Dutch patent application and patent, and in U.S. Pat. No. 3,967,144.

The invention will now be explained, by way of example, with reference to the accompanying drawing, wherein:

FIG. 1 diagrammatically shows the manner in which according to the invention a coating with a plastics foil is incised;

FIG. 2 is a top view of a plastics foil disc having two electrically insulated, circular conductive regions for use as electrodes, obtained through application of the method according to the present invention;

FIG. 3 shows two plastics discs which are incised according to a spiral path and designed such that upon stacking they provide a coil having a plurality of windings;

FIG. 4 is a plastics foil with a coating applied on a drum, which foil is treated according to the invention for providing a flat, two-core conductor; and FIG. 5 is a detail cross-section of the windings shown in FIG. 4 on the line V—V of FIG. 4.

As appears from FIG. 1 of the drawing in the method according to the invention a plastics foil 1 which is provided with a coating 2 is incised by means of a pointed part 3 of which only the pointed end is shown. As already mentioned in the above, for obtaining a line-shaped opening in the coating 2, which opening extends also through a part of the foil 1, seen in thickness direction, said part 3 is moved according to a line in contact with coating 2, while the temperature of the part 3 is situated in the melting range of foil 1 and the pressure exerted on part 3 and the rate of movement of said part 3 being so chosen that the coating 2 is entirely cut through, while the subjacent foil 1, seen in thickness direction, is only incised. The question is that as a result of the temperature of part 3, the plastics foil 1 adjacent said part 3 melts, whereby through the penetration of part 3 and the movement thereof according to the line the molten plastics foil 1 is laterally pushed aside, thereby entraining the superposed portion of coating 2. It is thus possible to incise according to a desired line-shaped path a foil 1 consisting of a random plastics material provided with a coating 2, likewise comprising a random material.

When the plastics foil 1 is light-transparent and the coating 2 is light-impermeable, it is thus possible to effect in coating 2 an incision according to a specific pattern, e.g. according to a specific image, which results in that, when foil 1 is exposed from the side opposite coating 2, the pattern applied by part 3 is viewed as a light pattern against a dark background, when viewed from the side of the plastics foil where the coating 2 is present.

In a further elaboration thereof it is possible by means of the part 3 to apply, slightly interspaced from each other, such incisions in such a light-transparent plastics foil 1 with a superposed, light-impermeable coating 2, so that for instance a so-called lattice used in the optical art can be formed.

Another application of the method resides in that the incision is effected in a coating 2 of an electrically conductive material which is present on a plastics foil 1. The coating may for instance consist of silver paint of the basis of a volatile thinner, e.g. butyl acetate.

It is thus possible to obtain a product, as shown in FIG. 2 of the drawing, using as starting point a plastics foil 1, in the present case circular, in the peripheral region of which there is initially present a conductive coating 2. Said coating 2 is now incised, using the method according to the invention, along the line 4, thus producing two electrically insulated, electrically conductive, in the present case circular, regions, which can each be connected to a discharge means, not shown, and which may serve in this manner as electrodes. In this connection reference is made to the construction which is described in the earlier cited Dutch patent application No. 7406582, wherein two electrodes 5 and 6 are present which are electrically insulated from each other by means of the subjacent plastics foil. Consequently, the present invention provides a very simple and effective manner to manufacture such a construction.

However, the invention is not restricted to the use of circular plastics foils and/or the application of a circular incision therein, as described in the above.

For instance FIG. 3 diagrammatically shows two plastics foils 1,1 of which one is depicted for the sake of explanation in a tilted condition. For the sake of illustration the plastics foils 1,1 are again designed as circular discs. The lower plastics foil 1 in FIG. 3 is provided at the top side thereof with a conductive coating 2, which, as appears from FIG. 3, is incised according to a spiral path 4, thus obtaining a part from the outer peripheral area of the foil 1, a spiral conductive path, the windings of said spiral being electrically insulated from each other.

The same method is applied for the plastics foil 1 shown at the top side of FIG. 3. In connection with the tilted condition of said plastics foil, the incision 4 made therein is shown in dotted lines. It appears from the figure that the sense of direction of the spiral path 4 of the one plastics foil 1 is precisely reversed to that of the other plastics foil 1.

When the outer end of the spiral conductive path 4 of the upper plastics foil 1 is extended to the bottom side of said foil, as shown by a dotted line, and the inner end of the spiral conductive path of the lower foil 1 is likewise extended to the bottom side of the respective foil, also shown by a dotted line, and the two foils 1,1 are then superposed, it will be clear that in such case there will be achieved a continuous, helical, electrically conductive path 4 which extends from the middle of the upper foil 1 to the exterior thereof, subsequently through the foil 1 and, shown diagrammatically by a full line, to the exterior of the lower foil 1 and then towards the inner end of the spiral path 4 associated with said foil 1, such that basically there is obtained a coil having a plurality of windings in a comparatively small volume.

It will be clear that this construction is not limited to the arrangement shown in FIG. 3 having two plastics foils 1,1 but that any required even number of such foils can be applied and so that in this manner the number of windings of the coil in question can be extended optionally.

When the spiral paths 4,4 are not extended to the centre of the plastics foils 1,1 as shown in FIG. 3, but always allow these to terminate at a distance therefrom, it is possible, in the stacked position of the plastics foil 1 to provide the same with a continuous central opening, not shown, wherein a rod of soft iron may be inserted, thus obtaining an electric magnet.

Another field in which the method according to the invention can be applied is the following. As shown in FIG. 4 of the drawing, a plastics foil 1 with a superposed electrically conductive coating 2 is pushed like a sleeve about a drum 5. The coating 2, in the manner as shown in FIG. 1, is helically incised, shown in FIG. 4, by rotating the drum 5 and by moving the part 3, not shown in FIG. 4, effecting the incision 4 simultaneously therewith in the axial direction of the drum 5 in contact with coating 2. There is thus obtained a helically incised sleeve on drum 5 which is thereafter provided with an insulating coating 6 and subsequently is cut over the total thickness of the two coatings 2 and 6 and the subjacent plastics foil 1 as far as the drum 5 according to a helix 7 positioned between the above mentioned incisions 4, as shown also in FIG. 4.

It will then be possible to unwind the thus formed helical winding from drum 5 thus obtaining a ribbon-shaped body provided with a carrier consisting of the plastics foil 1, two superposed electrically conductive paths of coating 2 extending in longitudinal direction of the strip and insulated electrically from each other and an electrically insulating coating 6 covering said paths; this is diagrammatically shown in FIG. 4 at the incision at the bottom end of drum 5. In elucidation thereof FIG. 5 shows the above construction again on an enlarged scale, one of the cross-sections of the helical winding being lifted off the drum surface.

The result of this method is consequently a striplike two-core conductor.

Another possible application of the invention, not shown, is the one in which a plastics foil 1 with superposed electrically conductive coating 2 is incised according to a spiral path 4 by means of two parts 3,3 corresponding to part 3 of FIG. 1, which parts 3,3 are disposed at a very small interspace, the conditions in which the method takes place being the same as those explained in the above. There is then obtained a plastics foil 1 having a superposed electrically conductive coating 2, which is entirely cut through, the plastics foil 1 being only incised, there being present two slightly interspaced, electrically insulated, electrically conductive paths of coating 2. Such a construction, in comparison with that shown in FIG. 2, has the advantage that the length dimension of the circular electrodes depicted in FIG. 2 is considerably increased in that said electrodes now have a spiral shape. Both formed electrically conductive paths, as explained in the above, can each again be connected separately to a discharge means, not shown.

It will be clear that this ensures the control of the resistance of the respective electrodes in a suitable manner. This may be advantageous when said construction is applied in the apparatus as described in the above cited Dutch patent application No. 7406582, Dutch Pat. No. 160,118 and U.S. Pat. No. 3,967,144.

It will furthermore be clear that the invention is in no way restricted to a specific plastics material of the foil 1 or a specific material of coating 2.

I claim:

1. A method of scribing a linear opening in a plastic foil having an electrically conductive coating thereon, said foil being in the form of a generally circular disc, said coating being formed along a peripheral region of said disc and from a silver suspension in a volatile solvent disposed on said peripheral region of said disc with said solvent evaporated to leave a silver deposit, comprising heating a first pointed part in the range of the melting temperature of said foil;

exerting pressure on and moving said part along a circular path and in contact with said coating so that said part passes entirely through said coating and partially through said foil to form two, electrically isolated regions; and connecting separate discharge means to said electrically isolated regions at reversible electrodes formed by electrochemical surface treatment thereof with HCl to form AgCl layers thereon.

2. A method of scribing linear openings in a plastic foil having an electrically conductive coating thereon, said foil being in the form of a disc, said coating being formed from a silver suspension in a volatile solvent disposed on said disc with said solvent evaporated to leave a silver deposit, comprising heating first and second pointed parts to temperatures in the range of the melting temperature of said foil;

exerting pressure on and moving said first and second parts along a spiral path with said second part being moved simultaneously with and parallel to, but spaced from said first part, and in contact with said coating so that said parts pass entirely through said coating and in said foil, to form two, spiral shaped electrically conductive regions which are electrically insulated from each other and which have inner and outer ends; and connecting discharge means to one end of each said region at reversible electrodes formed by electrochemical surface treatment thereof with HCl to form AgCl layers thereon.

* * * * *